United States Patent [19]

Coldren

[11] 4,445,218
[45] Apr. 24, 1984

[54] SEMICONDUCTOR LASER WITH CONDUCTIVE CURRENT MASK

[75] Inventor: Larry A. Coldren, Holmdel, N.J.

[73] Assignee: Bell Telephone Laboratories, Incorporated, Murray Hill, N.J.

[21] Appl. No.: 306,287

[22] Filed: Sep. 28, 1981

[51] Int. Cl.³ .............................................. H01S 3/19
[52] U.S. Cl. ...................... 372/44; 372/45; 372/46; 372/50; 372/43; 372/49
[58] Field of Search ................ 372/45, 46, 50, 96, 372/43, 44, 49

[56] References Cited

U.S. PATENT DOCUMENTS 4,023,993  5/1977  Scifres et al. ........................ 372/45
4,169,997 10/1979  Logan et al. ......................... 372/45

FOREIGN PATENT DOCUMENTS 54-37596  3/1979  Japan ..................................... 372/46

Primary Examiner—William L. Sikes
Assistant Examiner—Léon Scott, Jr.
Attorney, Agent, or Firm—Daniel D. Dubosky; Gregory C. Ranieri

[57] ABSTRACT

A semiconductor laser is disclosed wherein a grid-like conductive current mask is fabricated between the active region of the laser and one of its electrodes. In one embodiment, the conductive current mask is fabricated in the bottom regions of a corrugated pattern that is created along the length of the semiconductor laser. In a second embodiment, the conductive current mask is totally embedded within a lightly doped buffer layer that is grown proximate to the active region.

12 Claims, 5 Drawing Figures

4,445,218

SEMICONDUCTOR LASER WITH CONDUCTIVE CURRENT MASK

TECHNICAL FIELD

This invention relates to semiconductor lasers and, more particularly, to semiconductor lasers having a current mask.

BACKGROUND OF THE INVENTION

One type of laser which does not require end mirrors is the distributed feedback lasers described in U.S. Pat. No. 3,760,292 issued Sept. 18, 1973 to H. W. Kogelnik et al. In the distributed feedback laser the gain medium or the index of refraction is modulated at periodic intervals in order to provide reflections along the entire length of the gain medium. One form of distributed feedback laser that is proposed in the Kogelnik et al patent is a semiconductor laser in which a current mask is positioned within the laser structure in order to permit pumping or energizing current to pass through the active region of the laser only at periodic intervals along the length of the laser. Such a laser is shown in FIG. 5 of the Kogelnik et al patent. The net effect of the current mask is to produce a periodic gain variation within the semiconductor laser.

A new type of three terminal device was disclosed at the International Electron Devices Meeting in Washington, D.C., 1979 by scientists from the Massachusetts Institute of Technology, Lincoln Laboratory, Lexington, MA. This device is shown and described on page 130 of Electronics, Dec. 6, 1969. As shown in Electronics, the device is a permeable base transistor whose base consists of a layer of tungsten that has been patterned into a 3200 Å period grating layer which layer is epitaxially embedded in a single crystal of n-type gallium arsenide. This transistor wherein the base is a grid-like metallic structure is said to provide many advantages over gallium arsenide field effect transistors.

SUMMARY OF THE INVENTION

In accordance with the present invention, a grid-like conductive current mask is fabricated between the active region in a semiconductor laser and one of the electrodes between which the pump current flows. Changing the potential that is provided to this conductive current mask can regulate the light output from the semiconductor laser and also provide a means for adjusting the output wavelength in those lasers where the conductive current mask is sufficiently close to the active region to cause it to function as a distributed feedback laser. For maximum regulation, the conductive current mask is placed in a lightly doped buffer layer so that maximum modulation of the depletion depth around the current is obtained. Doping of this buffer layer must be sufficiently great, however, so that sufficient current to operate the laser is available.

In accordance with one embodiment of the present invention a semiconductor laser structure is etched in order to establish a pattern of grooves or notches over the active region along the length of the laser structure. A conductive terminal is deposited over the top parts of the notches that are not affected by the etching, and a conductive terminal is deposited over the entire bottom of the semiconductor laser structure thereby forming the two terminals through which the pump current flows. A third conductive layer is deposited at the bottoms of the grooves or notches to form the gate electrode which controls the pump current.

In accordance with the second embodiment a cladding region is epitaxially grown over the active region, and growth is terminated so that a conductive metallic grid can be deposited over the cladding layer. Epitaxial growth is then resumed and a top buffer layer of low conductivity is grown over the grid structure followed by a cap and contact layer. In this second embodiment, the grid structure is totally embedded within the cladding and top buffer layers, and contact to the grid structure must be made by grooves that are etched along the length of the semiconductor laser.

BRIEF DESCRIPTION OF THE DRAWING

The invention will be more readily understood after reading the following detailed description in conjunction with the drawings wherein.

DETAILED DESCRIPTION

Figure 1:
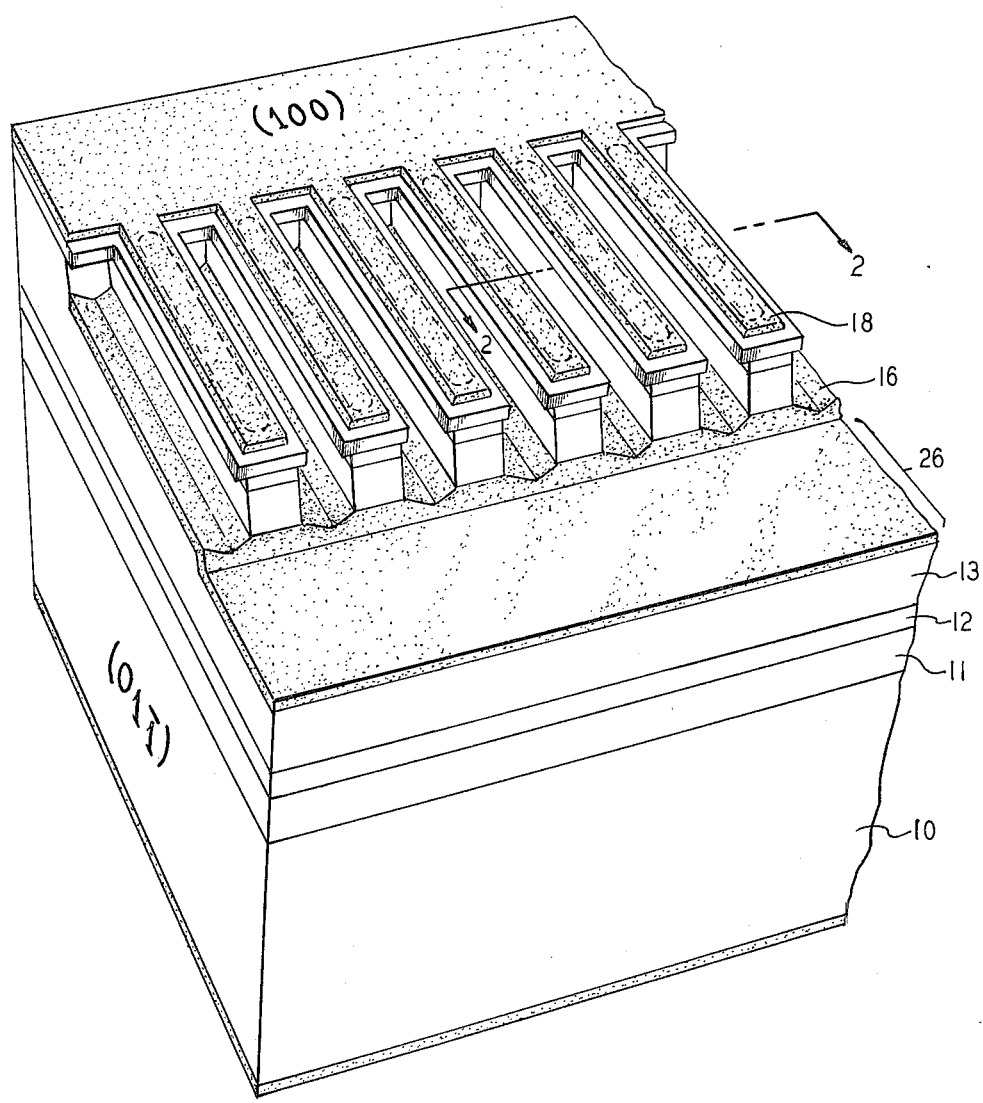
FIG. 1 is a pictorial drawing of a section of a semiconductor laser constructed in accordance with the present invention.
Figure 2:
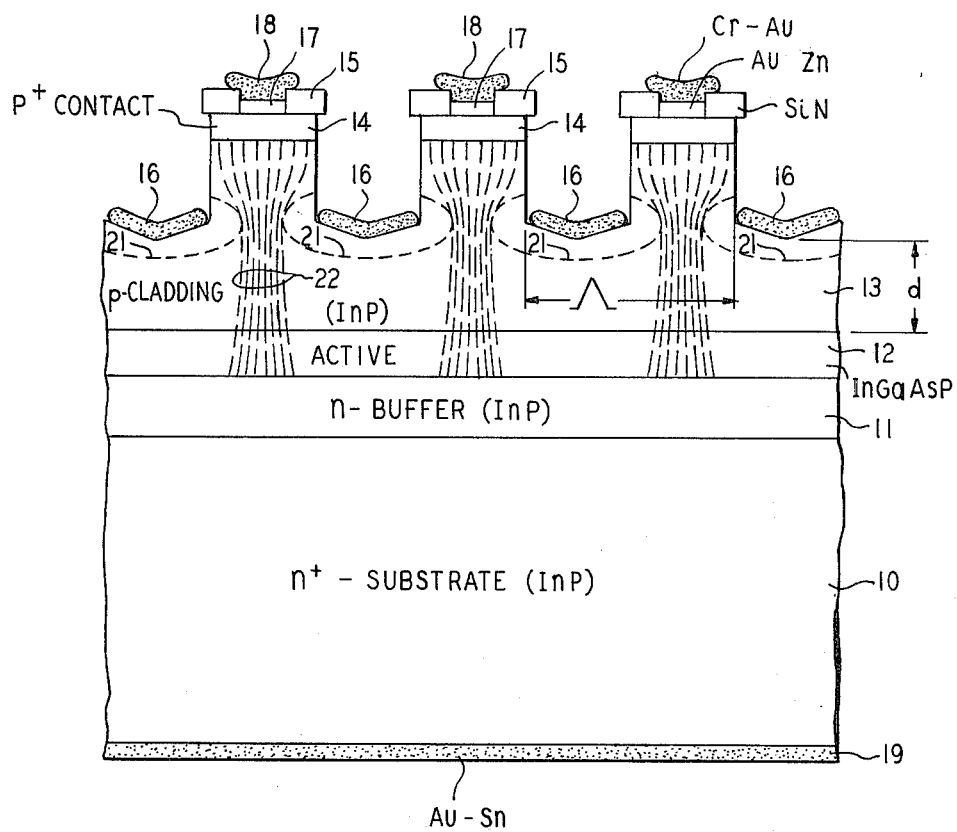
FIG. 2 is a cross sectional diagram of the device illustrated in FIG. 1.

One embodiment of the present invention is illustrated in the pictorial view shown in FIG. 1. A cross sectional view designated by the numeral 2 in FIG. 1 is shown in FIG. 2. The features and layers of this device are exaggerated in order to illustrate the construction. The device as shown is constructed by growing an epitaxial n-type buffer layer 11 of indium phosphide on an n+ substrate 10 of indium phosphide. This is then followed by an epitaxial growth of a quaternary layer 12 having a composition which will lase at the chosen wavelength. For the materials system used in this device using indium, gallium, arsenic and phosphorous, a wavelength of 1.3 $\mu$m would be typical. The active quaternary layer 12 is then covered by a cladding layer 13 of p-type indium phosphide which is grown relatively thick (about 2.5 $\mu$m) for the chosen wavelength of 1.3 $\mu$m. The cladding layer is then followed by the growth of a contact layer 14 of high conductivity p-type indium phosphide or quaternary material. The doping of cladding layer 13 should be sufficiently light so that the grid structure to be described hereinafter will be able to pinch off a channel width of about $\Lambda/2$ where $\Lambda$ is the period of the grid structure. However, the doping must be sufficiently high to carry the necessary current to operate the laser. The entire top structure of the epitaxially grown device is then covered with a silicon nitride layer 15.

Silicon nitride layer 15 is then coated with a photoresist, and the photoresist is exposed to produce a pattern which will permit etching of the layers in the indented areas of the device illustrated by the pictorial view in FIG. 1. This etching is initiated by a reactive ion etch using $CHF_3$ or a $CF_4+O_2$ mixture in a plasma etch geometry to cut through the silicon nitride layer. This step is then followed by a reactive ion etch using pure $Cl_2$ in order to cut away all of contact layer 14 and approximately 1 $\mu$m of the indium phosphide cladding layer 13 in the areas being etched. In order to alleviate problems that might result when using a photoresist, one could also use a titanium and aluminum mask over the silicon nitride and $Cl_2+O_2$ for a reactive ion etch of the indium phosphide cap layer.

At this point in time, the device will begin to resemble the one illustrated in FIG. 1. A 5 second immersion of the device in concentrated hydrochloric acid is used to smooth the InP and slightly undercut the silicon nitride layer in order to produce an overhang of the silicon nitride layer of approximately 0.2 μm as illustrated in FIG. 1. This overhang is desirable in order to prevent the material which is deposited in the following step from adhering to the sidewalls of the posts in the corrugated pattern produced during the reactive ion etch. Alternatively, if the corregation period Λ is sufficiently large, the etching may be wholly accomplished with HCl alone. It is important that the mask be oriented as shown in FIG. 1 so that the side walls of the corrugated pattern be $(01\bar{1})$ or $(0\bar{1}1)$ crystal planes after HCl etching.

A material that will form a good blocking contact with the cladding material is then deposited over the top surface of the device in order to create a gating electrode 16 which exists not only in the bottom-most regions of the notches that are created but also extends out over portion 26 of the cladding region which is exposed at the front edge of the device illustrated in FIG. 1. In this context, a blocking contact is defined as one which will cause a depletion of the surrounding material when the appropriate bias is applied. This action can be provided by reverse biased p-n, Schottky barrier, or metal-insulator-semiconductor junctions. In the embodiment illustrted in FIGS. 1 and 2, where the cladding layer is p-type InP, the gating electrode can be fabricated from a gold-germanium-alloy. Firing at a suitably elevated temperature may be used to improve the blocking quality of the gate. The gold-germanium that is deposited over the mask covering the ridges is then removed by using the appropriate resist stripper to remove the photoresist mask, or by using sodium hydroxide to remove a titanium+ aluminum mask.

A second resist pattern is then formed over the device to create windows in the top posts of the corrugated pattern. A plasma etch can be used to cut through the silicon nitride in these windows and a gold-zinc layer 17 can then be deposited in the windows and fired if necessary in order to produce a good ohmic contact with the high conductivity contact layer 14. A third mask pattern using a photoresist material is then utilized to create a chromium gold layer 18 which not only makes contact with the windowed layers 17 but also extends out over the rear portion of the device shown in FIG. 1 in order to provide an extended contact to the anode of the diode which has been constructed.

The devices on a single wafer can then be separated either by sawing or by using a bromine-methanol solution. It should be apparent to those skilled in the art that end mirrors can then be formed by cleaving or by a suitable etching procedure in those cases where the device may be part of a more complicated integrated optics structure.

If the spacing d is made sufficiently small ($\sim\lambda$) and the period is chosen to satisfy the Bragg condition, distributed feedback section will occur. Then the output surfaces would not have to be mirrors, and they could be AR coated to prevent unwanted reflection. The device should in FIGS. 1 and 2 is utilized by applying a positive potential to anode contact 18 and a negative potential to the cathode contact 19 which is a gold-zinc contact that has been deposited over the entire bottom surface of substrate 10. Application of a negative potential to the gating electrode 16 then creates depletion regions of the type shown and designated in FIG. 2 as regions 21. These depletion regions can be utilized to pinch off current that is flowing from anode 18 before this current passes through the active layer 12 in a manner illustrated by the current lines 22 shown in FIG. 2. Hence gating electrode is not only a current mask but is a current mask that can change its degree of effectiveness depending on the potential that is applied.

Figure 3:
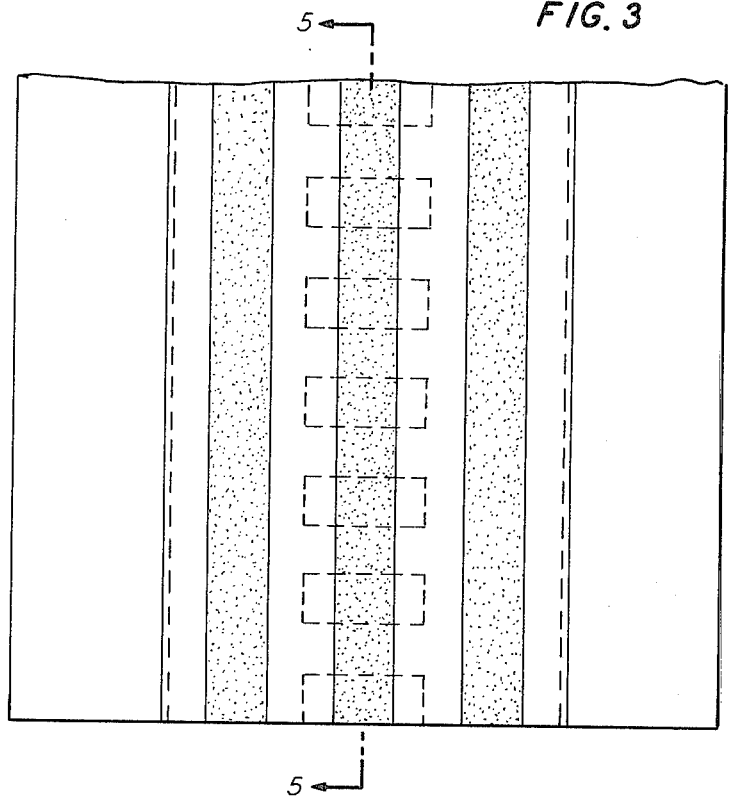
FIGS. 3 and 4 are top and end views, respectively, of a second embodiment constructed in accordance with the present invention.
Figure 4:
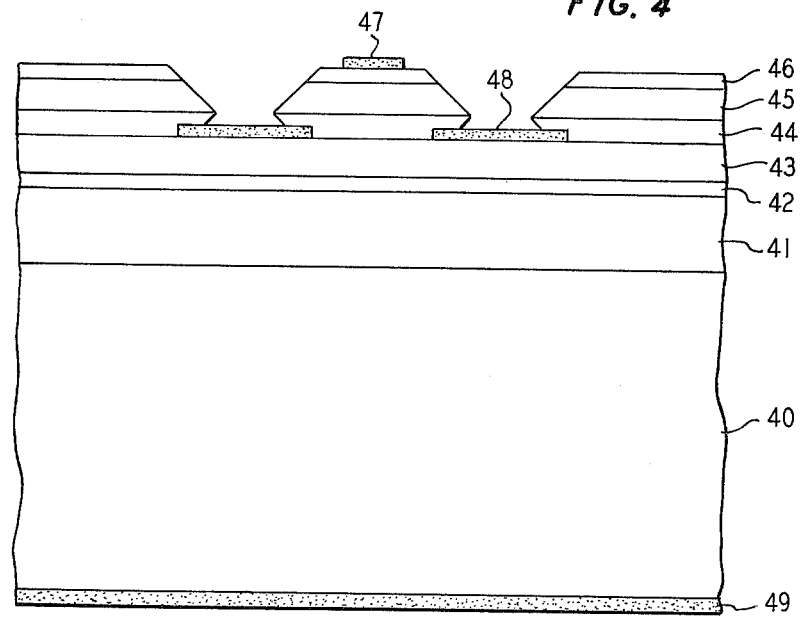
Figure 5:
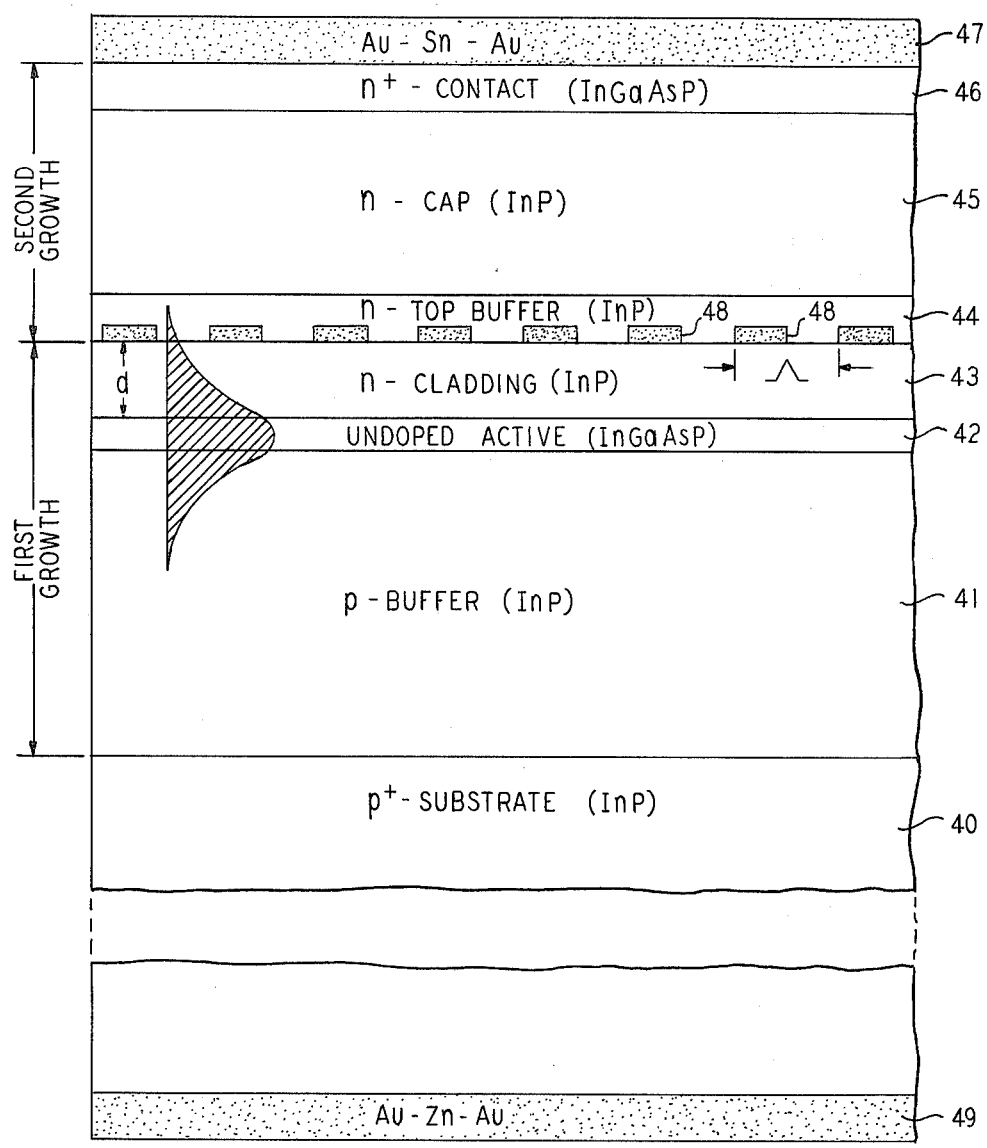
FIG. 5 is a cross sectional diagram of the device illustrated in FIGS. 3 and 4.

A second embodiment of the present invention can be constructed to provide a device of the type illustrated in FIGS. 3, 4 and 5. FIGS. 3 and 4 are top and side views of the device, and FIG. 5 is a cross sectional view of the device through a plane designated by the numeral 5 in FIG. 3. This embodiment is constructed by first growing a p-type buffer layer 41 of indium phosphide on p+ substrate 40 of indium phosphide. This growth is followed by an undoped active quaternary layer 42 and an n-type cladding layer 43 of indium phosphide. These layers are identical to those which are grown for a typical double heterostructure laser fabricated on a p-type substrate except the n+ contact layer normally grown on a double heterostructure is left off. For distributed feedback action, cladding layer 43 is grown to a thickness (d) that is sufficiently small to permit the evanescent field of the optical mode to reach its top surface.

The growth of layers 41, 42 and 43 illustratively involves the preparation of a (100) cadmium or zinc doped substrate with a Bromine-methanol polish-etch. The substrate is inserted into the liquid phase epitaxial system and heated to approximately 650 degrees C. and permitted to cool at a rate of about 0.5 degrees C. per minute, while melts suitable for growing the first set of layers shown in FIG. 5 are alternately slid into position on the substrate.

After the cladding layer 43 has been grown, the device is removed from the liquid phase epitaxial system and the cladding layer 43 is immediately coated with a photoresist and exposed with the desired grating period, Λ. If distributed feedback operation is desired, the period, Λ, is chosen to provide Bragg reflection at the laser wavelength.

At this point, a tungsten or conductive carbon gating electrode 48 may be evaporated over the photoresist pattern. If desired, shallow grooves may first be formed by plasma etching in order to allow the tungsten or carbon gating electrode 48 to be recessed into the surface of the n-type cladding layer 43. This recessing can provide a planar surface for the growths which are to follow.

After solvent cleaning, the entire substrate is then placed into the liquid phase epitaxial system and a lightly doped n-type top buffer layer 44 of indium phosphide is grown over the gating electrode 48. This top buffer layer 44 is followed by an n-type cap layer 45 of indium phosphide and a heavily doped quaternary contact layer 46. Contact is made to the gating electrode 48 by etching channels along the entire length of the device as illustrated in FIGS. 3 and 4. A cathode electrode 47 of gold and tin is then deposited over the entire length of the device, and a gold-zinc anode electrode 49 is formed over the entire bottom surface of substrate 40.

By choosing the electrical bias applied to gating electrodes 16 and 48 in either of the described embodiments and selecting various layer thicknesses and dopings during growth, several modes of operation are possible for both embodiments. If the separation d between the gating electrode 16 or 48 and the active layer is large, that is, d is much greater than the operating wavelength, there will be no distributed feedback action and the devices will function only as modulated Fabry-Perot lasers with end mirrors required. The gating electrode under these circumstances can be utilized to modulate the level of the laser output. High modulation efficiency and speed will be provided through the transistor action of the gating electrode.

If, however, the gating electrode is brought to within a wavelength of the active quaternary layer and the period $\Lambda$ chosen to meet the Bragg criteria, distributed feedback action will be added by the resulting spatially periodic gain. In the latter case all of the reflections required can be provided by the gating electrode, and the end mirrors are no longer necessary, thereby permitting the device to be incorporated into a complex integrated optics structure. Wavelength control is expected to be possible while the laser provides a constant output by simultaneously varying the anode bias and the voltage applied to the gating electrode. Again, high modulation efficiency and speed is realized by modulating only the gate electrode.

What has been described hereinabove are two illustrative embodiments of the present invention. The first describes a p on n configuration while the second describes an n on p configuration. Two more embodiments are possible by interchanging n for p and vice-versa in both cases, provided only that the associated contacting materials are also changed in accordance with the layer to which they are applied.

What is claimed is:

1. In a semiconductor laser having an active region and at least two electrodes between which a potential can be established to cause a pump current to flow through said active region, the active region being disposed between the electrodes, characterized in that said semiconductor laser has at least one gating electrode for regulating light output from the semiconductor laser, said gating electrode being comprised of a conductive material and being disposed intermediate a space separating one of either of said two electrodes and said active region.

2. The combination as defined in claim 1 wherein said gating electrode is fabricated as a single layered structure positioned in a lightly doped buffer layer proximate to said active region.

3. The combination as defined in claim 1 wherein said gating electrode is fabricated in the bottom regions of a corrugated structure created along the length of said semiconductor laser.

4. The combination as defined in claim 3 wherein said corrugated structure has a period, $\Lambda$.

5. A semiconductor device adapted for use as a laser comprising a substrate of III-V semiconductor material having a first electrode fabricated on one of its surfaces and a plurality of epitaxial layers grown on an opposite surface, one of said plurality of layers including an active region which generates light in response to a pumping current, a second electrode structure fabricated on said plurality of epitaxial layers such that a potential can be applied between said first and second electrodes to develop a pumping current which flows through said active region, the active region being disposed between the electrodes, characterized in that said semiconductor device has at least one current mask for regulating light output from the semiconductor device said current mask being comprised of conductive material and being positioned intermediate a space separating said second electrode and said active region.

6. A semiconductor device as defined in claim 5 wherein said plurality of epitaxial layers includes a lightly doped buffer layer proximate to said active region and said conductive current mask is disposed within said lightly doped epitaxial layer.

7. A semiconductor device as defined in claim 5 wherein said plurality of epitaxial layers is notched to create a corrugated pattern, and said conductive current mask is fabricated in the bottom regions of said corrugated pattern.

8. A semiconductor device as defined in claim 7 wherein said corrugated pattern is fabricated to have a period, $\Lambda$.

9. A semiconductor device adapted for use as a laser comprising a substrate of one type conductivity having a first electrode means fabricated on one surface and a first epitaxial layer of said one type conductivity grown on an opposite surface of said substrate, an active layer epitaxially grown on said first epitaxial layer, a plurality of cladding layers of opposite conductivity grown on said active layer, and a second electrode means fabricated on the top surface of said cladding layers, said first and second electrode means responsive to an applied potential for causing a pumping current to flow through said active layer characterized in that said plurality of cladding layer has at least one grid-like conductive current mask to which a potential can be applied for regulating the flow of said pumping current, said grid-like conductive current mask being comprised of conductive material and being positioned between said second electrode means and said active layer.

10. A semiconductor device as defined in claim 9 wherein said plurality of cladding layers includes a lightly doped layer, and said grid-like conductive current mask is disposed within said lightly doped cladding layer.

11. A semiconductor device as defined in claim 9 wherein a notched pattern is created in said plurality of cladding layers along the length of said active layer, said second electrode means is positioned at the topmost regions of said notched pattern and said grid-like conductive current mask is positioned at the bottom regions of said notched pattern.

12. A semiconductor device as defined in claim 11 wherein said notched pattern is fabricated with a period, $\Lambda$.

* * * * *